United States Patent
Dobrovolny

[11] Patent Number: 5,834,988
[45] Date of Patent: Nov. 10, 1998

[54] FREQUENCY COMPENSATED PIN DIODE ATTENUATOR

[75] Inventor: Pierre Dobrovolny, North Riverside, Ill.

[73] Assignee: Zenith Electronics Corporation, Glenview, Ill.

[21] Appl. No.: 815,559

[22] Filed: Mar. 12, 1997

[51] Int. Cl.⁶ .................................................. H03H 7/24
[52] U.S. Cl. .............................................. 333/81 R
[58] Field of Search .............................. 333/81 R, 81 A

[56] References Cited

U.S. PATENT DOCUMENTS

| 4,097,827 | 6/1978 | Williams | 33/81 R |
| 4,236,126 | 11/1980 | Weller et al. | 333/81 R |

FOREIGN PATENT DOCUMENTS

| 57-44314 | 3/1982 | Japan | 333/81 R |
| 57-54414 | 3/1982 | Japan | 333/81 R |
| 1-117408 | 5/1989 | Japan | 333/81 R |
| 1-146415 | 6/1989 | Japan | 333/81 R |

Primary Examiner—Paul Gensler

[57] ABSTRACT

An attenuator for signals in the frequency band of 50 to 800 MHz is subject to a range of AGC signal attenuating potentials. The attenuator includes a first attenuating PIN diode connected in series between an input and an output. The opposite ends of the first PIN diode are AC coupled via second and third impedance matching PIN diodes to an AC ground. The first PIN diode exhibits a frequency dependent slope over the wide signal frequency band and the range of AGC potentials. First and second inductors, in the form of metallic foil strips, are connected between the second and third PIN diodes and the AC ground. The foil strips are positioned in close proximity to each other and arranged such that signal currents flow therein in opposite directions to establish a negative mutual coupling coefficient for compensating for the frequency dependent slope of the first PIN diode.

5 Claims, 3 Drawing Sheets

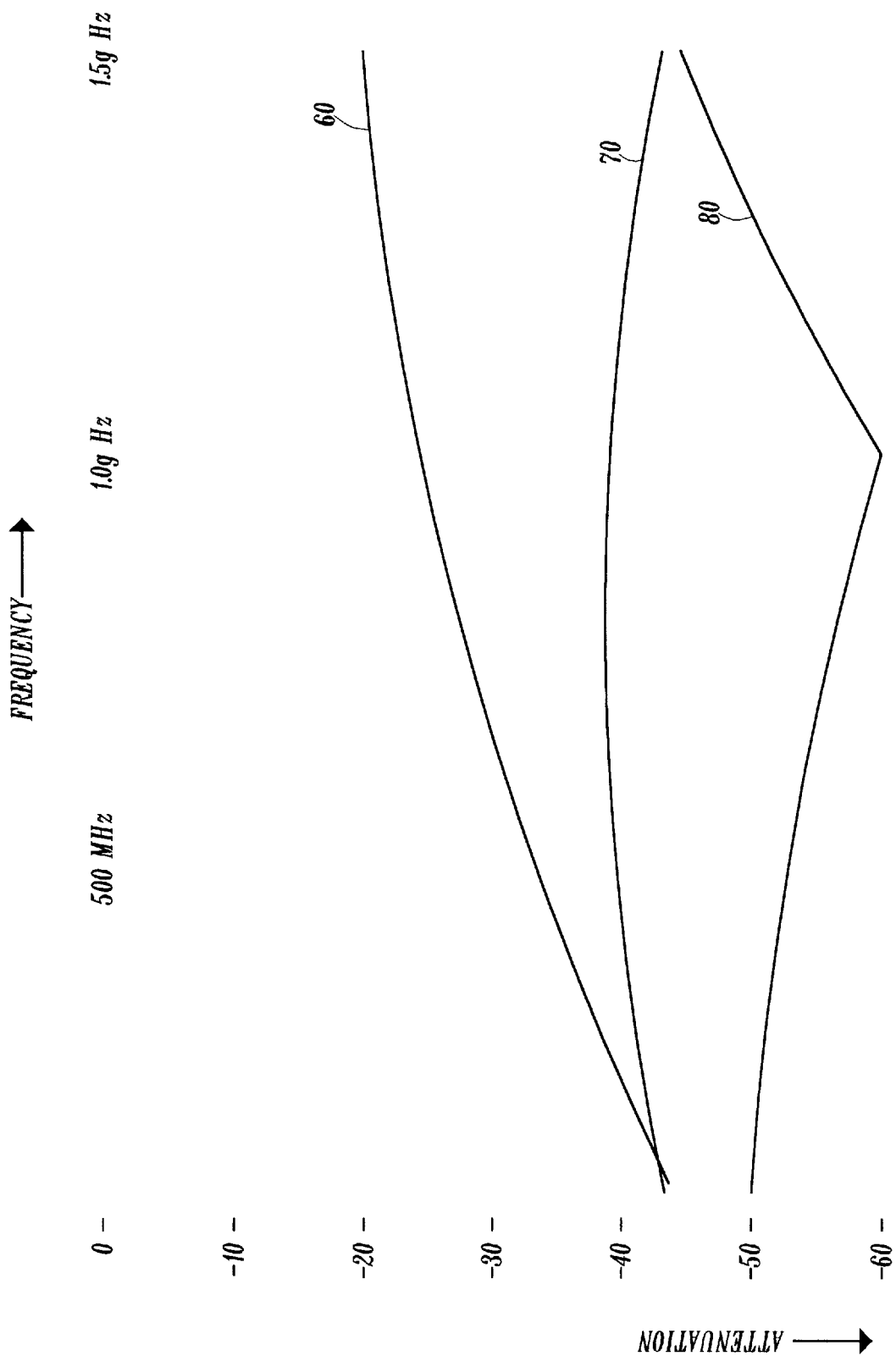

FREQUENCY COMPENSATED PIN DIODE ATTENUATOR

BACKGROUND OF THE INVENTION AND PRIOR ART

This invention relates in general to high frequency tuners and in particular to PIN diode attenuators for high frequency television receiver tuners that operate in a frequency band that embraces 50 to 800 MHz.

It is well known that, in the frequency band of the invention, stray and parasitic capacitances, lead lengths, and component configurations and placement are often critical to acceptable performance. With the advent of digital Advanced Television (ATV), the need for wideband linear tuners has taken on even greater importance.

PIN diode attenuators are well known in the art. The difficulty with them is that the PIN diode is never an ideal "open" or "short" circuit when processing the very high frequency signals required for HDTV applications. In effect, the PIN diode exhibits the characteristics associated with a parallel connection of a resistance and a small capacitance. Therefore, at higher frequencies, the attenuation of a series-connected PIN diode attenuator tends to fall off. Further, the problem is exacerbated when the AGC range is considered, because the effect of the AGC range in attenuating the signals at the higher frequency portion of the frequency band is diminished. Since the PIN diode attenuator is positioned in front of the RF tuner section, it is extremely important that maximum attenuation and a flat frequency response be available to protect the tuner circuits from signal overload. The present invention substantially extends the useful AGC range and compensates for the frequency dependent slope that the PIN diode attenuator would otherwise exhibit over the frequency band of interest.

OBJECTS OF THE INVENTION

A principal object of the invention is to provide a novel PIN diode attenuator for high frequency television and other signals.

Another object of the invention is to provide a PIN diode attenuator that is compensated to provide a relatively flat frequency response over a wide band of signal frequencies and wide range of AGC levels.

A further object of the invention is to provide a compensated PIN diode attenuator that has a low minimum insertion loss and is relatively inexpensive to manufacture.

BRIEF DESCRIPTION OF THE DRAWINGS

These and other objects and advantages of the invention will become apparent upon reading the following description in conjunction with the drawings, in which:

FIG. 5 is a series of curves showing the benefits of the invention.

DESCRIPTION OF THE PREFERRED EMBODIMENT

Figure 1:
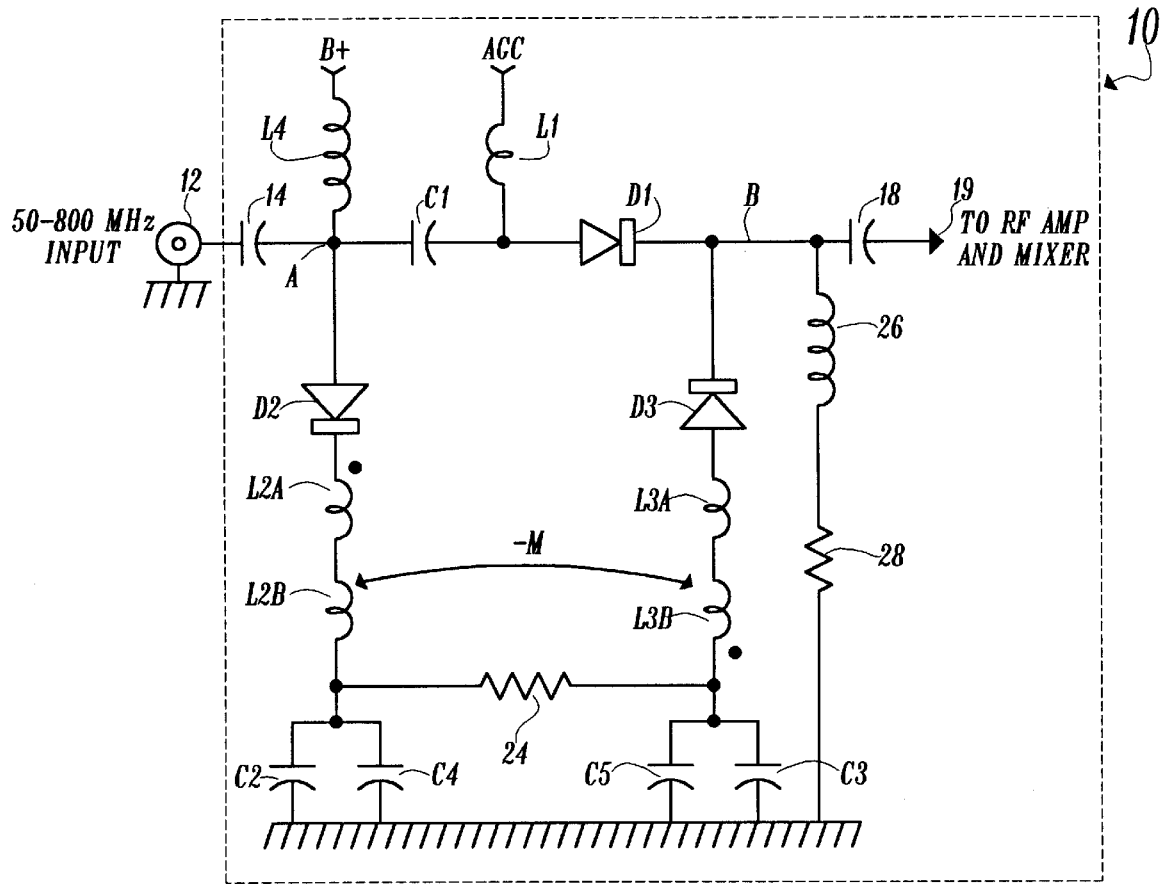
FIG. 1 is a simplified schematic diagram of the compensated PIN diode attenuator of the invention.

Referring to FIG. 1, a television tuner front end 10 is indicated by a dashed line box. A coaxial input terminal 12 receives signals in the frequency band of 50 to 800 MHz. (It will be appreciated that higher frequency signals, around several gigahertz, may also be employed.) The input impedance is approximately 75 ohms. The selected signal is coupled via a capacitor 14 and a capacitor C1 to the anode of a PIN diode D1. A source of fixed DC voltage (B+) is coupled through a choke L4 to a junction A between capacitors 14 and C1. A variable AGC voltage is applied through a choke L1 to the junction of C1 and the anode of PIN diode D1. The cathode of PIN diode D1 (junction B) is coupled through a capacitor 18 to a terminal 19 that supplies a signal to an RF amplifier and mixer circuit (not shown) in tuner front end 10. PIN diode D2 has its anode connected to junction A and its cathode connected to series-connected compensating inductors L2A and L2B. Similarly, PIN diode D3 has its cathode connected to junction B and its anode connected to series-connected compensating inductors L3A and L3B. The other terminals of L2B and L3B are connected together through a resistor 24 and separately to a ground plane via pairs of parallelly connected bypass capacitors C2,C4 and C3,C5, respectively. A circuit consisting of a series connection of a choke 26 and a resistor 28 is coupled from junction B to ground to close the DC current loop controlling the resistance of the series PIN diode D1 and the resistance of the shunt PIN diodes D2 and D3. As indicated by "-M" in the figure, compensating inductors L2A,L2B and L3A,L3B are in a coupling arrangement with each other to produce a negative coupling coefficient.

Figure 2:
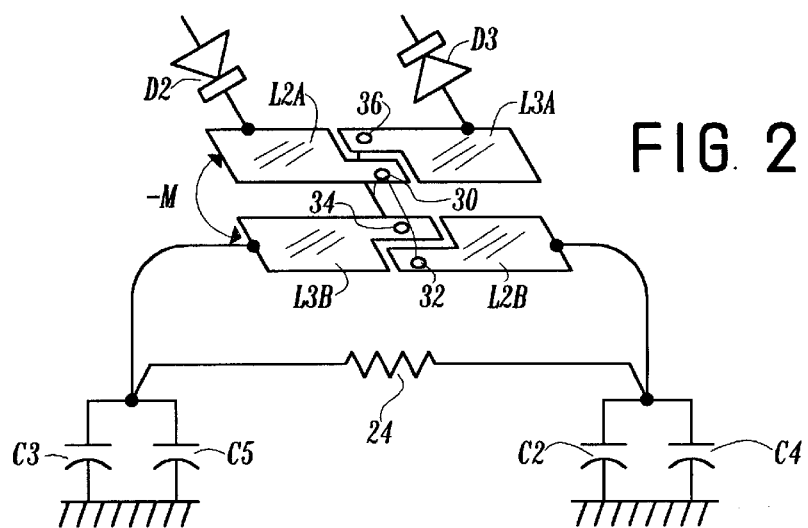
FIG. 2 illustrates the arrangement of the compensating inductors for achieving a negative mutual coupling coefficient.

As indicated in FIG. 2, compensating inductors L2A,L2B and L3A,L3B are in the form of metallized foils (striplines) on opposite sides of a printed circuit board (not shown). The foils are positioned in close proximity to each other along their long dimensions and overlie one another. Inductors L2A and L2B are on opposite sides of the printed circuit board and are connected together via "plated-through" holes 30 and 32, respectively. Similarly, inductors L3A and L3B are on opposite sides of the printed circuit board and are connected together via plated-through holes 36 and 34, respectively. Their connections are such that signal currents flowing therein are in opposite directions, giving rise to a negative mutual coupling coefficient between the inductors.

In practice, the tuner front end is miniaturized on a high quality (glass) printed circuit board, with the compensating inductors L2A,L2B and L3A,L3B comprising printed conductive foils thereon and with a ground foil nearby. As those skilled in the art readily recognize, the entire arrangement is designed to eliminate or minimize lead lengths to the various components, which can have a very serious degrading effect upon circuit performance.

By way of description and not of limitation, all of the coupling capacitors are 0.02 microfarads, resistor 24 is 470 ohms, resistor 28 is 5600 ohms and all chokes are 1.5 microHenries. The capacitors and resistors are all surface mounted types. The inductance values of inductors L2A, L2B, L3A, L3B and the mutual inductance M are very small, between one and several nH (nanoHenries), and are dependent mainly on the parasitic capacitance of diode D1 and on the frequency range of compensation. The diodes are current type PIN diodes, preferably with an OFF capacitance not exceeding 1.25 pF.

Figure 3:
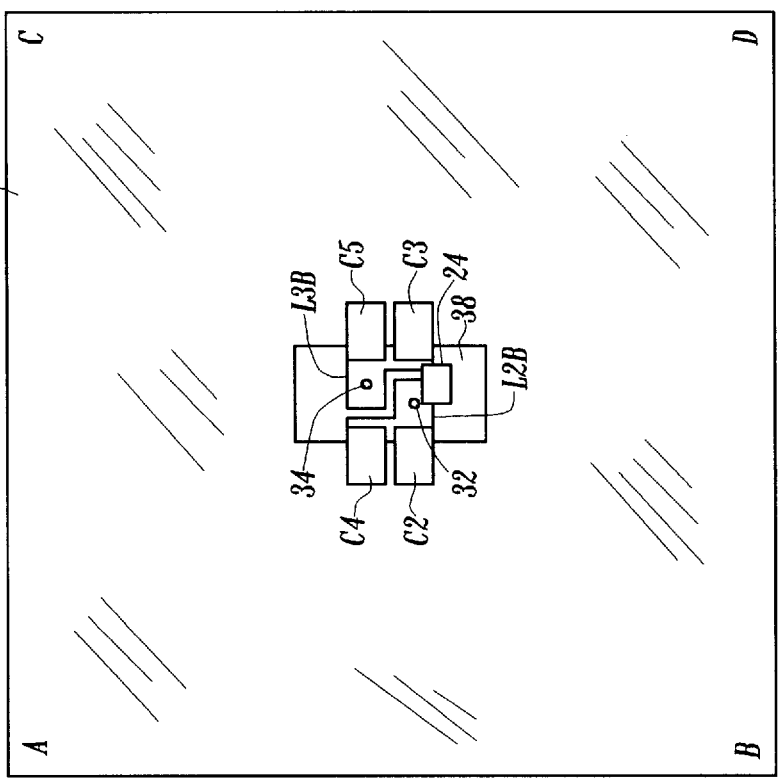
FIGS. 3 and 4 illustrate the front and rear sides of a printed circuit board implementation of the invention.
Figure 4:
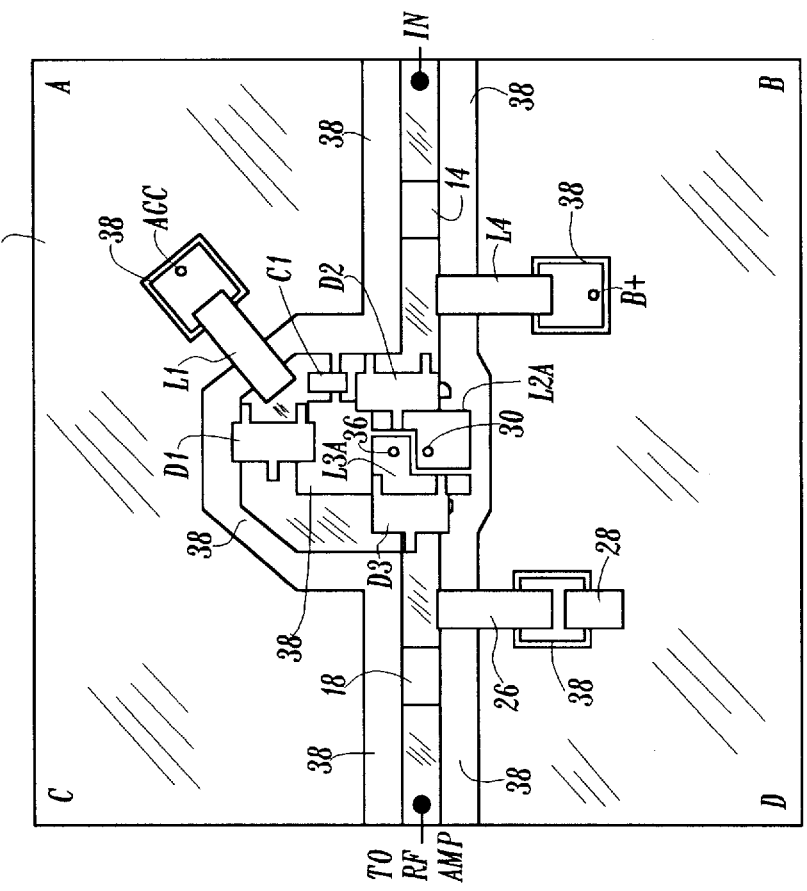

The printed circuit board implementation of the compensated tuner front end is shown in FIGS. 3 and 4, which show the opposite sides of the printed circuit board. Matching the corner designations A, B, C and D of FIGS. 3 and 4 will reproduce the foil pattern and component placement of the actual printed circuit board. The ground foil areas are indicated as 20 and 22 in FIGS. 3 and 4, respectively, with the open areas 38 being identified. As may readily be seen, the surface mounted components bridge sections of the foil to form the circuit arrangement depicted in the FIG. 1 schematic diagram. This type of contruction is typical in high frequency work and therefore needs no detailed description. Particular note should be taken however of the placement of the inductors L2A, L2B, L3A and L3B.

FIG. 5 shows three curves, with curve 60 representing the frequency response of the maximum attenuation of the PIN attenuator without any compensation, curve 70 representing the attenuation of the circuit with a first fixed value of B+and curve 80 showing a similar representation with a different fixed value of B+. In the area of particular interest to television signals (500 MHz to 860 Mhz), the compensated curves 70 and 80 are relatively flat and exhibit a high degree of attenuation as compared with the uncompensated curve 60. Clearly, the benefits of the compensation circuit are apparent from these curves.

What has been described is a novel wideband, low loss PIN diode attenuator with a relatively flat frequency response for a large range of attenuation levels. It is recognized that numerous modifications and changes in the described embodiment of the invention will be apparent to those skilled in the art without departing from its true spirit and scope. The invention is to be limited only as defined in the claims.

What is claimed is:

1. A wideband attenuator for translating a band of high frequecy signals, said attenuator being subject to a range of AGC signal attenuation potentials, comprising:

an input and an output;

a first PIN diode connected in series between said input and said output, said first PIN diode exhibiting a frequency dependent slope over said frequency band and said AGC range;

a second and a third PIN diode coupled to opposite terminals of said first PIN diode;

means for establishing a AC ground;

compensating means coupling the cathode of said second PIN diode and the anode of said third PIN diode to said AC ground, respectively, for compensating said first PIN diode for said frequency dependent slope, said compensating means comprising:

first and second inductors coupling said cathode and said anode, respectively to said AC ground; and means for establishing a negative mutual coupling coefficient between said first and said second inductors.

2. The attenuator of claim 1, wherein said first and said second inductors comprise metallic foil strips positioned adjacent to each other such that signal currents therein flow in opposite directions and establish said negative mutual coupling coefficient.

3. The attenuator of claim 2, wherein said frequency band embraces 50 to 800 MHz.

4. The attenuator of claim 3, further including capacitor elements for establishing said AC ground.

5. A wideband attenuator for translating high frequency signals in a band of 50 to 800 MHz, said attenuator being subject to a range of AGC signal attenuation potentials, comprising:

an input and an output;

a first PIN diode connected in series between said input and said output, said first PIN diode exhibiting a frequency dependent slope over said frequency band and said AGC range;

a second and a third PIN diode connected to opposite terminals of said first PIN diode;

capacitor means for establishing an AC ground;

first and second inductors coupling the cathode of said second PIN diode and the anode of said third PIN diode, respectively, to said capacitor means; and said first and said second inductors comprising metallic foil strips positioned adjacent to each other such that signal currents therein flow in opposite directions to establish a negative mutual coupling coefficient for compensating for said frequency dependent slope of said first PIN diode.

* * * * *